US012795854B2

(12) United States Patent
Geng et al.

(10) Patent No.: US 12,795,854 B2
(45) Date of Patent: Nov. 10, 2026

(54) LIQUID COOLING CABINET APPARATUS

(71) Applicants: SQ TECHNOLOGY(SHANGHAI) CORPORATION, Shanghai (CN); INVENTEC CORPORATION, Taipei City (TW)

(72) Inventors: Zhao Geng, Shanghai City (CN); Guang-Zhao Tian, Shanghai City (CN); Hong-Chou Lin, Taipei City (TW); Yu-Fan Chen, Taipei City (TW)

(73) Assignees: SQ TECHNOLOGY(SHANGHAI) CORPORATION, Shanghai (CN); INVENTEC CORPORATION, Taipei City (TW)

( * ) Notice: Subject to any disclaimer, the term of this patent is extended or adjusted under 35 U.S.C. 154(b) by 276 days.

(21) Appl. No.: 18/745,174

(22) Filed: Jun. 17, 2024

(65) Prior Publication Data

US 2025/0380377 A1 Dec. 11, 2025

(30) Foreign Application Priority Data

Jun. 5, 2024 (CN) ........................ 202410727851.X

(51) Int. Cl.
*H05K 7/20* (2006.01)

(52) U.S. Cl.
CPC ..... *H05K 7/20236* (2013.01); *H05K 7/20781* (2013.01)

(58) Field of Classification Search
CPC ........................ H05K 7/20236; H05K 7/20781
USPC .......................................................... 361/699
See application file for complete search history.

(56) References Cited

U.S. PATENT DOCUMENTS

| | | | | |
|---|---|---|---|---|
| 10,925,188 | B1 * | 2/2021 | Keehn | H05K 7/20718 |
| 2007/0227710 | A1 * | 10/2007 | Belady | H05K 7/2079 165/122 |
| 2008/0017355 | A1 * | 1/2008 | Attlesey | G06F 1/20 165/104.33 |
| 2014/0218858 | A1 * | 8/2014 | Shelnutt | H05K 7/203 361/679.31 |
| 2024/0138111 | A1 * | 4/2024 | Liu | H05K 7/20272 |

* cited by examiner

*Primary Examiner* — Zhengfu J Feng
(74) *Attorney, Agent, or Firm* — Maschoff Brennan

(57) ABSTRACT

A liquid cooling cabinet apparatus is configured to accommodate a coolant. The liquid cooling cabinet apparatus includes a cabinet, a first electronic device, a second electronic device and an optical fiber coupler assembly. The cabinet has an accommodation space and a first arrangement area. The accommodation space is configured to accommodate the coolant, and the first arrangement area is located outside the accommodation space. The first electronic device and the second electronic device are located in the accommodation space and configured to be immersed by the coolant. The optical fiber coupler assembly is disposed in the first arrangement area. The first electronic device and the second electronic device are in signal communication with each other via the optical fiber coupler assembly.

7 Claims, 4 Drawing Sheets

LIQUID COOLING CABINET APPARATUS

CROSS-REFERENCE TO RELATED APPLICATIONS

This non-provisional application claims priority under 35 U.S.C. § 119(a) on Patent Application No(s). 202410727851.X filed in China, on Jun. 5, 2024, the entire contents of which are hereby incorporated by reference.

BACKGROUND OF THE INVENTION

Technical Field of the Invention

The invention relates a liquid cooling cabinet apparatus.

Description of the Related Art

The use of immersion liquid cooling is to increase power of a single cabinet in a data center to increase computing density per unit area while achieving maximum energy efficiency ratio between unit energy and resource consumption, which is to achieve the goal of saving energy. Therefore, improving equipment operating efficiency is the goal pursued by immersion liquid cooling data centers.

Regarding to network cable system of the data center, what needs to be considered are various possible situations that may occur when network cable system is immersed in coolant. As the network transmission rate upgrades from 100G to 400G and to 800G in the future, the transmission efficiency of the network cable system is required to be higher, so optical transmission system is currently considered to be used. However, how to prevent coolant from affecting the signal transmission quality of the optical transmission system is still an issue to be solved in this field.

SUMMARY OF THE INVENTION

The invention provides a liquid cooling cabinet apparatus which can ensure the signal transmission quality of the optical transmission system.

One embodiment of the invention provides a liquid cooling cabinet apparatus. The liquid cooling cabinet apparatus is configured to accommodate a coolant. The liquid cooling cabinet apparatus includes a cabinet, a first electronic device, a second electronic device and an optical fiber coupler assembly. The cabinet has an accommodation space and a first arrangement area. The accommodation space is configured to accommodate the coolant, and the first arrangement area is located outside the accommodation space. The first electronic device and the second electronic device are located in the accommodation space and configured to be immersed by the coolant. The optical fiber coupler assembly is disposed in the first arrangement area. The first electronic device and the second electronic device are in signal communication with each other via the optical fiber coupler assembly.

According to the liquid cooling cabinet apparatus as discussed in the above embodiment, the optical fiber coupler assembly is disposed in the first arrangement area located outside the accommodation space of the cabinet, and the first electronic device and the second electronic device located in the accommodation space of the cabinet are in signal communication with each other via the optical fiber coupler assembly, such that the coolant in the cabinet does not contact the optical fiber coupler assembly, which prevents the coolant from refracting light signal, thereby ensuring signal transmission quality.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
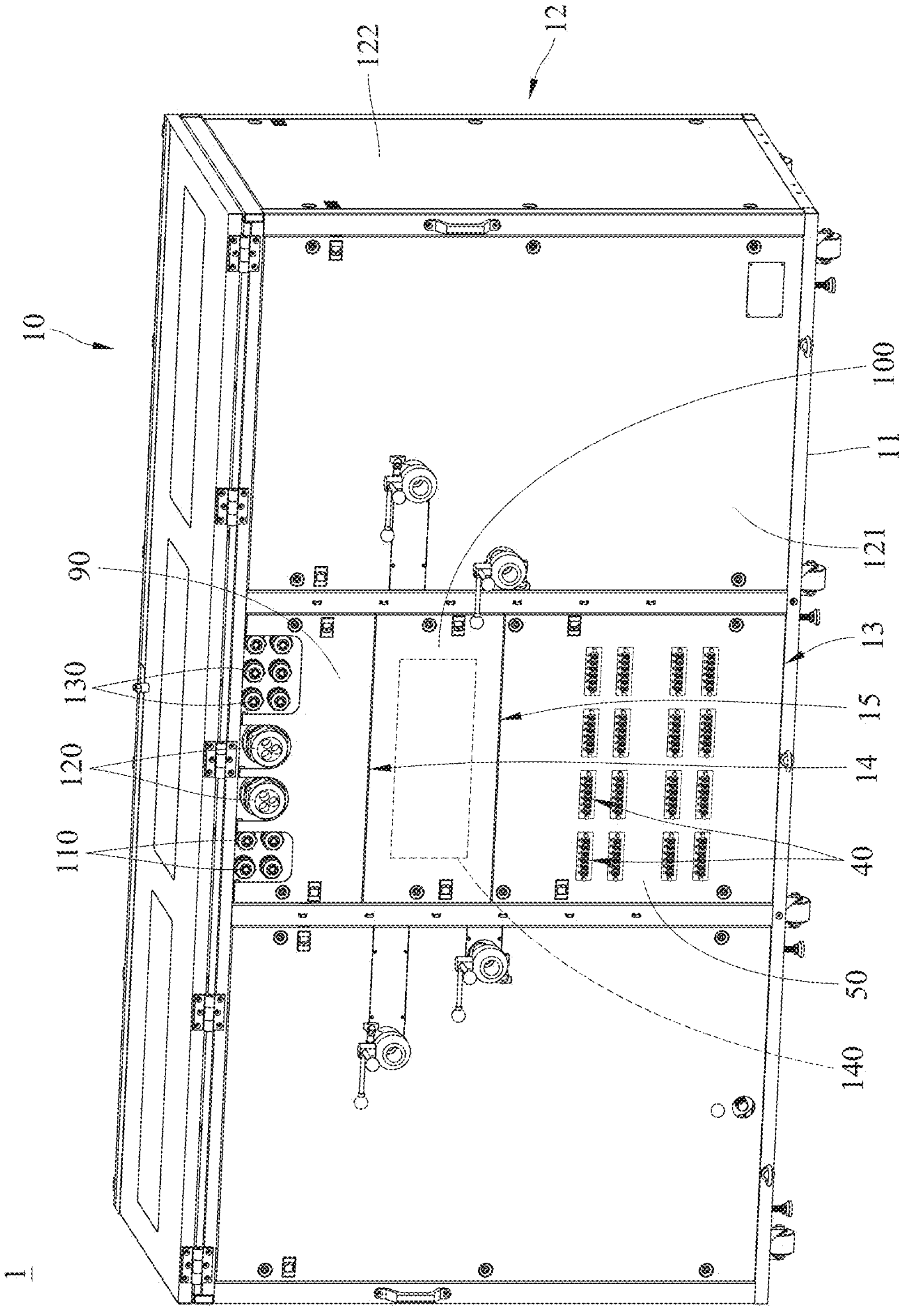
FIG. 1 is a perspective view of a liquid cooling cabinet apparatus according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
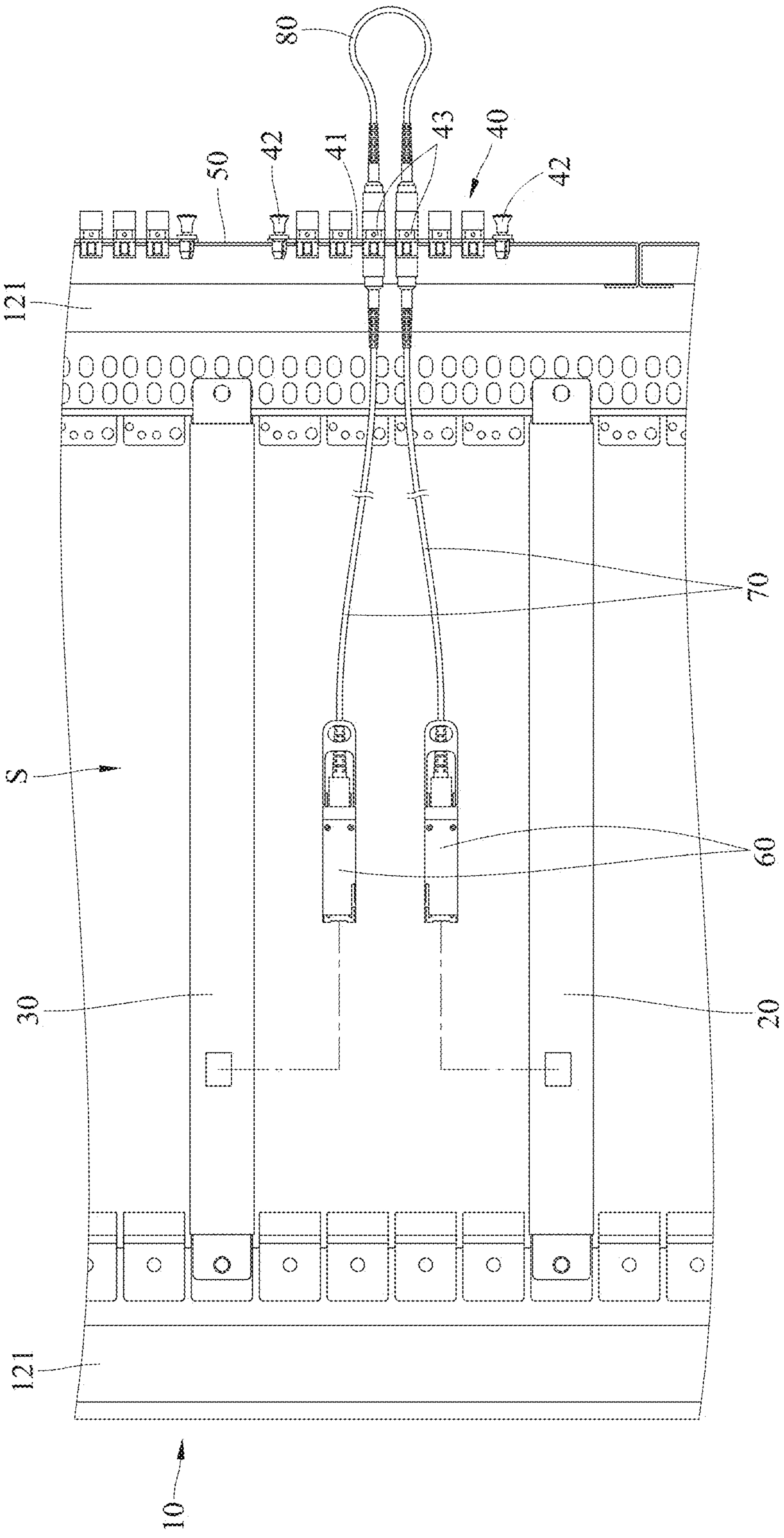
FIG. 2 is a partial top view of the liquid cooling cabinet apparatus in FIG. 2 when a top cover portion of a cabinet is removed.
Figure 3:
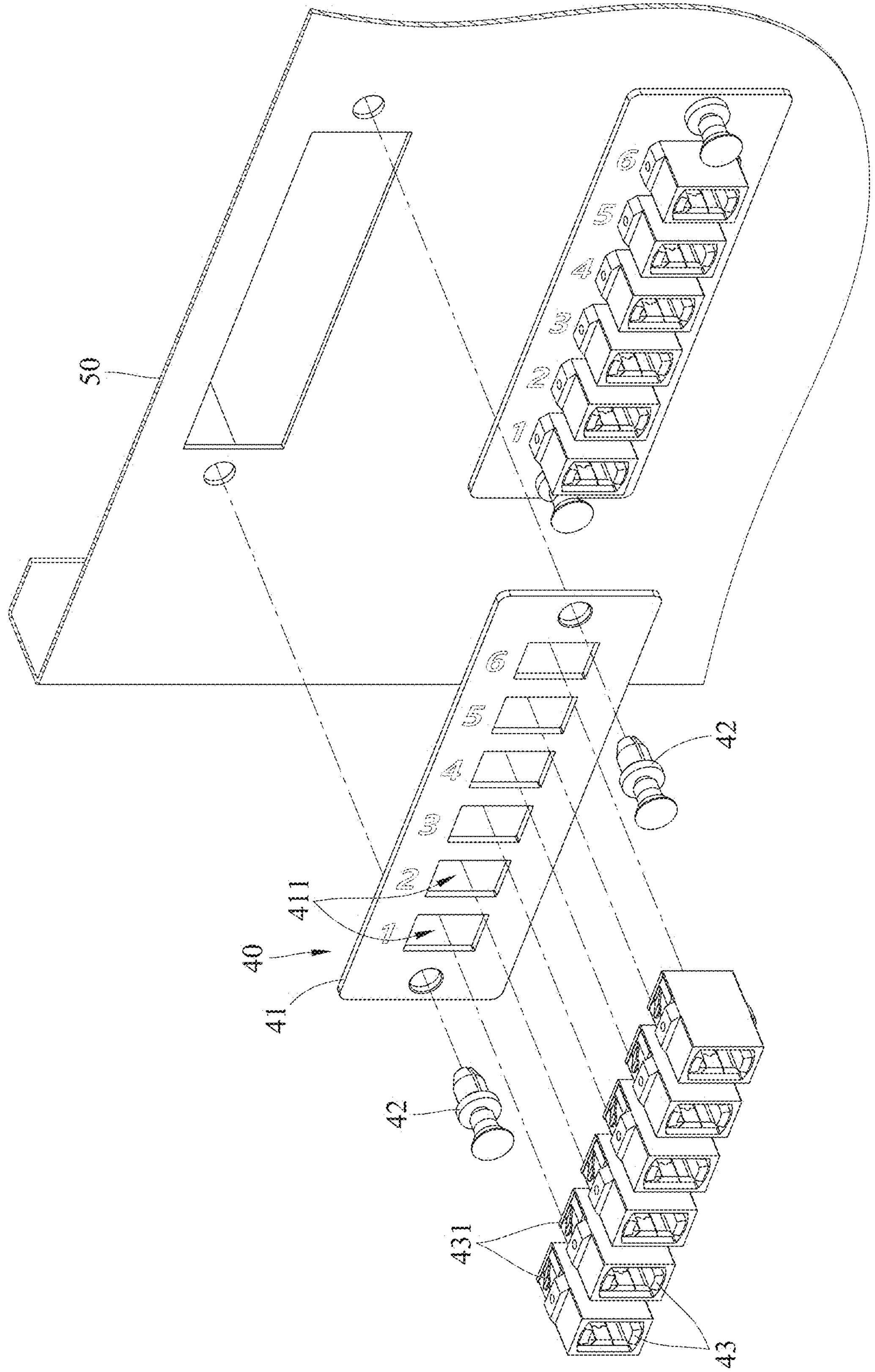
FIG. 3 is an exploded view of an optical fiber coupler assembly and a first cover of the liquid cooling cabinet apparatus in FIG. 1.

Referring to FIGS. 1 to 3, FIG. 1 is a perspective view of a liquid cooling cabinet apparatus according to one embodiment of the invention, FIG. 2 is a partial top view of the liquid cooling cabinet apparatus in FIG. 2 when a top cover portion of a cabinet is removed, and FIG. 3 is an exploded view of an optical fiber coupler assembly and a first cover of the liquid cooling cabinet apparatus in FIG. 1.

In this embodiment, the liquid cooling cabinet apparatus 1 is configured to accommodate a coolant (not shown), where the coolant is, for example, a fluorinated liquid. The liquid cooling cabinet apparatus 1 includes a cabinet 10, a first electronic device 20, a second electronic device 30 and a plurality of optical fiber coupler assemblies 40.

The cabinet 10, for example, includes a bottom portion 11 and a wall portion 12. The wall portion 12, for example, includes two long plates 121 and two short plates 122. The two long plates 121 and the two short plates 122 are respectively connected to different sides of a periphery of the bottom portion 11, such that the long plates 121, the short plates 122 and the bottom portion together form an accommodation space S which has a rectangular shape. The accommodation space S is configured to accommodate the coolant. In this embodiment, the cabinet 10 has a first arrangement area 13, and the first arrangement area 13 is located on one of the long plates 121 and located at one side of this long plate 121 facing away from the accommodation space S.

The optical fiber coupler assemblies 40 are disposed in the first arrangement area 13. For example, the liquid cooling cabinet apparatus 1 may further include a first cover 50. The first cover 50 is fixed in the first arrangement area 13 of the cabinet 10 via, for example, hook structures and screws. The optical fiber coupler assemblies 40 are the same in structure, and thus the following descriptions specifically introduce one of them only. The optical fiber coupler assembly 40, for example, includes a frame 41, a plurality of fasteners 42 and a plurality of optical fiber couplers 43. The fasteners 42 are, for example, expansion anchors. The frame 41 is fixed on the first cover 50 via the fasteners 42. The frame 41, for example, has a plurality of engagement holes 411. Each of the optical fiber couplers 43, for example, has an engagement protrusion 431. The engagement protrusions 431 of the optical fiber couplers 43 are respectively engaged in the engagement holes 411 of the frame 41. The optical fiber couplers 43 are located outside the cabinet 10 so as not to contact the coolant in the cabinet 10.

Note that the optical fiber couplers 43 are not restricted to being fixed on the frame 52 via the engagement protrusions 431 and the engagement holes 411. In some other embodiments, the optical fiber couplers may be fixed on the frame via another suitable means. On the other hand, the first cover 50 is an optional component and may be omitted in some other embodiments. In such a configuration, the optical fiber coupler assembly may be directly disposed on the cabinet.

The first electronic device 20 is, for example, a server, and the second electronic device 30 is, for example, a network switch. The first electronic device 20 and the second electronic device 30 are located in the accommodation space S and are configured to be immersed by the coolant.

In this embodiment, the liquid cooling cabinet apparatus 1, for example but not limited to, includes two optical modules 60, two first optical fiber cables 70 and a second optical fiber cable 80.

The two optical modules 60 are located in the accommodation space S of the cabinet 10 and are configured to be sealed and immersed by the coolant. The two optical modules 60 are respectively in signal communication with the first electronic device 20 and the second electronic device 30, and the two optical modules 60 are respectively in signal communication with two of the optical fiber couplers 43 via the two first optical fiber cables 70. For example, the two first optical fiber cables 70 are disposed through the long plate 121 of the cabinet 10, the positions of the long plate 121 where the two first optical fiber cables 70 are disposed through are sealed, and the two first optical fiber cables 70 are connected to the two optical fiber couplers 43 via female joints. The two optical fiber couplers 43 are in signal communication with each other via, for example, the second optical fiber cable 80. For example, two opposite ends of the second optical fiber cable 80 are respectively connected to the two optical fiber couplers 43 with male joints. As a result, the first electronic device 20 and the second electronic device 30 are in signal communication with each other via the two optical modules 60, the two first optical fiber cables 70, the two optical fiber couplers 43 and the second optical fiber cable 80.

In this embodiment, the optical fiber coupler assembly 40 is disposed in the first arrangement area 13 located outside the accommodation space S of the cabinet 10, and the first electronic device 20 and the second electronic device 30 located in the accommodation space S of the cabinet 10 are in signal communication with each other via the optical fiber coupler assembly 40, such that the coolant in the cabinet 10 does not contact the optical fiber coupler assembly 40, which prevents the coolant from refracting light signal, thereby ensuring signal transmission quality.

Moreover, the optical modules 60 are sealed and immersed in the coolant, the positions of the long plate 121 where the two first optical fiber cables 70 are disposed through are sealed, the first optical fiber cables 70 are connected to the two optical fiber couplers 43 at the outside of the cabinet 10, and the second optical fiber cable 80 connected to the two optical fiber couplers 43 are located outside the cabinet 10, such that the signal transmission path between the first electronic device 20 and the second electronic device 30 is not affected by the coolant, thereby further ensuring signal transmission quality.

In addition, the optical modules 60 are immersed in the coolant and are sealed, which facilitates the maintenance and management of the optical modules 60. Furthermore, the coolant can cool the optical modules 60 for ensuring the reliability of the optical modules in 60.

On the other hand, in this embodiment, the optical fiber couplers 43 and the second optical fiber cable 80 are located at the outside of the first cover 50, which facilitates the installation/removal and the maintenance/management of the second optical fiber cable 80. The first optical fiber cables 70 are managed at the inside of the first cover 50, and there is less chance to maintain the first optical fiber cables 70.

Note that the quantity of the first electronic device 20 and the quantity of the second electronic device 30 are not restricted to being one and may be modified to be plural in other embodiments. Moreover, the quantity of the optical fiber coupler assemblies 40 are not restricted to being plural and may be modified to be one in other embodiments.

Figure 4:
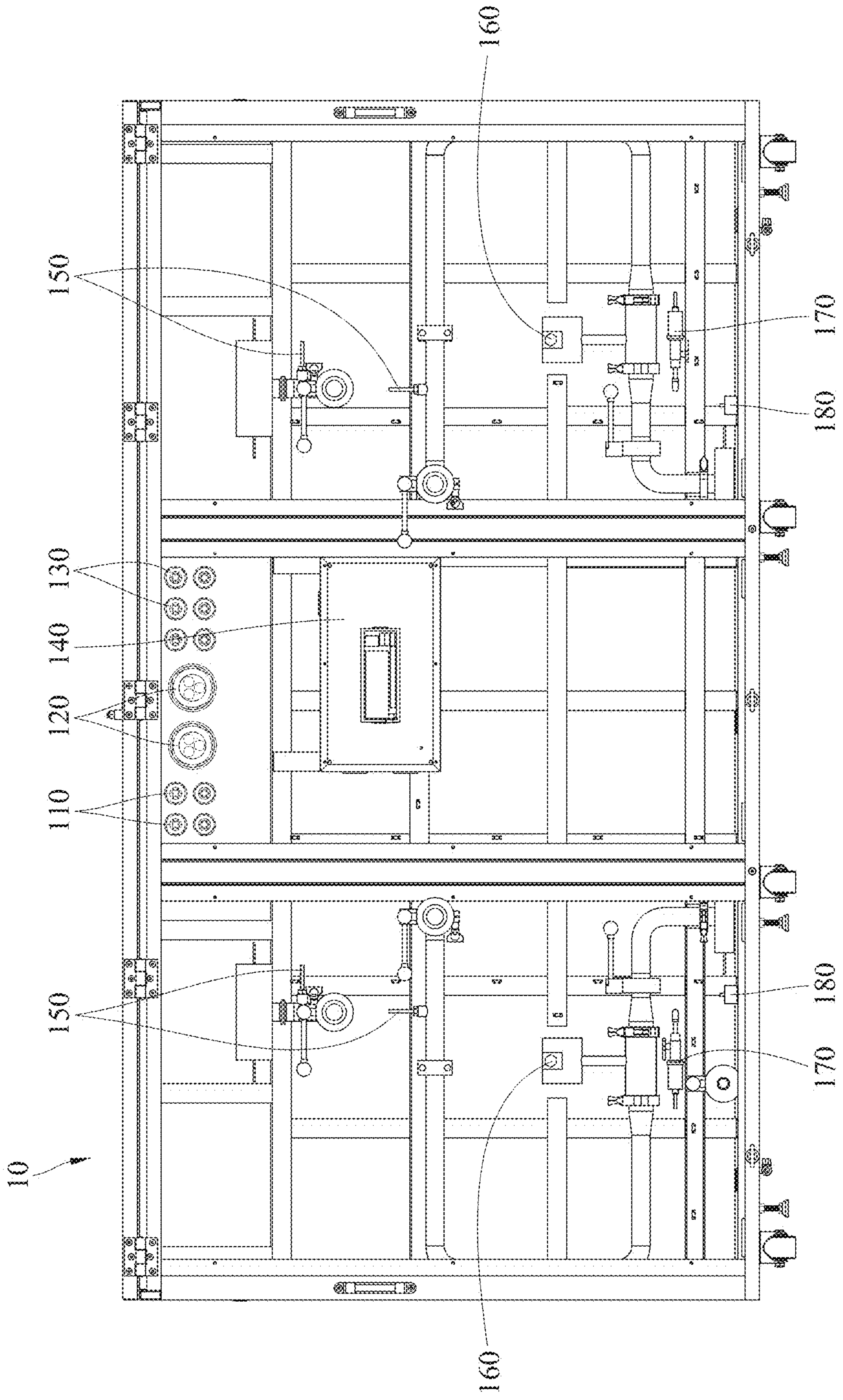
FIG. 4 is a side view of the liquid cooling cabinet apparatus in FIG. 4 when all covers are removed.

Then, referring to FIGS. 1 and 4, FIG. 4 is a side view of the liquid cooling cabinet apparatus in FIG. 4 when all covers are removed. In this embodiment, the cabinet 10, for example, further has a second arrangement area 14 and a third arrangement area 15. The first arrangement area 13, the second arrangement area 14 and the third arrangement area 15 are located on the same long plate 121, and are located at one side of this long plate 121 facing away from the accommodation space S. The third arrangement area 15 is located between the first arrangement area 13 and the second arrangement area 14, and the first arrangement area 13 is located closer to the bottom portion 11 than the second arrangement area 14 and the third arrangement area 15.

In addition, the liquid cooling cabinet apparatus 1 may further include a second cover 90, a third cover 100, a plurality of connectors 110, 120 and 130 and a control board 140. The second cover 90 and the third cover 100 are respectively fixed in the second arrangement area 14 and the third arrangement area 15 of the cabinet 10 via, for example, hook structures and screws. The connectors 110, 120 and 130 are disposed on the second cover 90, and the connectors 110, 120 and 130 are disposed in the second arrangement area 14 via the second cover 90. The connectors 110, 120 and 130 are sealed connectors and, for example, include M32 gland connectors 110 for the installation of RJ45 cables, M75 gland connectors 120 for the installation of industrial cables and M20 gland connectors 130 for the installation of optical fibers. The control board 140 is disposed in the third arrangement area 15 and is covered by the third cover 100. The control board 140 is, for example, electrically connected to a plurality of sensors 150, 160, 170 and 180 disposed on the cabinet 10. These sensors 150, 160, 170 and 180 include temperature sensors 150, flow rate sensors 160, liquid level sensors 170 and leakage detection sensors 180.

Note that the first arrangement area 13, the second arrangement area 14 and the third arrangement area 15 are not restricted to being located at the same long plate 121 and may be modified to be located at any positions of the wall portion 12 of the cabinet 10 in other embodiments. In addition, the heights of the first arrangement area 13, the second arrangement area 14 and the third arrangement area 15 relative to the bottom portion 11 may be modified as required. Moreover, the second cover 90, the third cover 100, the connectors 110, 120 and 130 and the control board 140 are optional components and may be omitted in other embodiments.

According to the liquid cooling cabinet apparatus as discussed in the above embodiment, the optical fiber coupler assembly is disposed in the first arrangement area located outside the accommodation space of the cabinet, and the first electronic device and the second electronic device located in the accommodation space of the cabinet are in signal communication with each other via the optical fiber coupler assembly, such that the coolant in the cabinet does not contact the optical fiber coupler assembly, which prevents the coolant from refracting light signal, thereby ensuring signal transmission quality.

Moreover, the optical modules are sealed and immersed in the coolant, the positions of the long plate where the two first optical fiber cables are disposed through are sealed, the first optical fiber cables are connected to the two optical fiber couplers at the outside of the cabinet, and the second optical fiber cable connected to the two optical fiber couplers are located outside the cabinet, such that the signal transmission path between the first electronic device and the second electronic device is not affected by the coolant, thereby further ensuring signal transmission quality.

In addition, the optical modules are immersed in the coolant and are sealed, which facilitates the maintenance and management of the optical modules. Furthermore, the coolant can cool the optical modules for ensuring the reliability of the optical modules.

On the other hand, the optical fiber couplers and the second optical fiber cable are located at the outside of the first cover, which facilitates the installation/removal and the maintenance/management of the second optical fiber cable. The first optical fiber cables are managed at the inside of the first cover, and there is less chance to maintain the first optical fiber cables.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A liquid cooling cabinet apparatus, configured to accommodate a coolant, comprising:

- a cabinet, having an accommodation space and a first arrangement area, wherein the accommodation space is configured to accommodate the coolant, and the first arrangement area is located outside the accommodation space;
- a first electronic device and a second electronic device, located in the accommodation space and configured to be immersed by the coolant; and
- an optical fiber coupler assembly, disposed in the first arrangement area, wherein the first electronic device and the second electronic device are in signal communication with each other via the optical fiber coupler assembly;
- wherein the liquid cooling cabinet apparatus further comprises a plurality of connectors and a control board, the cabinet further has a second arrangement area and a third arrangement area which are located outside the accommodation space, the plurality of connectors are disposed in the second arrangement area, and the control board is disposed in the third arrangement area;
- wherein the liquid cooling cabinet apparatus further comprises a first cover, a second cover and a third cover, the first cover is disposed in the first arrangement area, the optical fiber coupler assembly is disposed on the first cover, the second cover is disposed in the second arrangement area, the plurality of connectors are disposed on the second cover, and the third cover is disposed in the third arrangement area and covers the control board;
- wherein the optical fiber coupler assembly comprises a frame, a plurality of fasteners and a plurality of optical fiber couplers, the frame is fixed to the first cover via the plurality of fasteners, the frame has a plurality of engagement holes, each of the plurality of optical fiber couplers has an engagement protrusion, the engagement protrusions of the plurality of optical fiber couplers are respectively engaged in the plurality of engagement holes of the frame, the first electronic device and the second electronic device are respectively in signal communication with two of the plurality of optical fiber couplers, and the two of the plurality of optical fiber couplers which are in signal communication with the first electronic device and the second electronic device are in signal communication with each other.

2. The liquid cooling cabinet apparatus according to claim 1, wherein the cabinet comprises a bottom portion and a wall portion, the wall portion is connected to a periphery of the bottom portion, the bottom portion and the wall portion together form the accommodation space, and the first arrangement area, the second arrangement area and the third arrangement area are located at the wall portion.

3. The liquid cooling cabinet apparatus according to claim 2, wherein the third arrangement area is located between the first arrangement area and the second arrangement area, and the first arrangement area is located closer to the bottom portion than the second arrangement area and the third arrangement area.

4. The liquid cooling cabinet apparatus according to claim 3, wherein the wall portion comprises two long plates and two short plates, the two long plates, the two short plates and the bottom portion together form the accommodation space which has a rectangular shape, and the first arrangement area, the second arrangement area and the third arrangement area are located at one of the two long plates.

5. The liquid cooling cabinet apparatus according to claim 1, wherein the plurality of optical fiber couplers are located outside the cabinet so as not to contact the coolant.

6. The liquid cooling cabinet apparatus according to claim 1, further comprising two optical modules and two first optical fiber cables, wherein the two optical modules are located in the accommodation space of the cabinet and are configured to be sealed and immersed by the coolant, and the first electronic device and the second electronic device are respectively in signal communication with the two of the plurality of optical fiber couplers via the two optical modules and the two first optical fiber cables.

7. The liquid cooling cabinet apparatus according to claim 6, further comprising a second optical fiber cable, wherein two opposite ends of the second optical fiber cable are respectively connected to the two of the plurality of optical fiber couplers which are in signal communication with the first electronic device and the second electronic device.

* * * * *